(12) United States Patent
Bybell

(10) Patent No.: US 8,751,898 B2
(45) Date of Patent: Jun. 10, 2014

(54) UTILIZING ERROR CORRECTING CODE DATA ASSOCIATED WITH A REGION OF MEMORY

(75) Inventor: Anthony J. Bybell, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 13/534,053

(22) Filed: Jun. 27, 2012

(65) Prior Publication Data

US 2014/0006903 A1 Jan. 2, 2014

(51) Int. Cl.
*H03M 13/00* (2006.01)

(52) U.S. Cl.
USPC .......................................... 714/758; 714/773

(58) Field of Classification Search
USPC ................... 709/207; 711/118; 370/392, 252; 714/764, 769, 758, 773
See application file for complete search history.

(56) References Cited

U.S. PATENT DOCUMENTS

| 6,789,156 | B1 | 9/2004 | Waldspurger |
| 7,085,988 | B1 | 8/2006 | Weng |
| 7,617,241 | B2 | 11/2009 | Yang |
| 7,660,865 | B2 * | 2/2010 | Hulten et al. ................. 709/207 |
| 7,673,099 | B1 * | 3/2010 | Beaverson et al. ........... 711/118 |
| 7,979,670 | B2 | 7/2011 | Saliba et al. |
| 7,990,973 | B2 * | 8/2011 | Hao et al. ...................... 370/392 |
| 8,112,585 | B2 * | 2/2012 | Patel et al. .................... 711/118 |
| 8,443,261 | B2 * | 5/2013 | Waldspurger et al. ........ 714/764 |
| 2010/0037118 | A1 | 2/2010 | Saliba et al. |
| 2010/0185922 | A1 | 7/2010 | Haas et al. |
| 2011/0113115 | A1 | 5/2011 | Chang et al. |
| 2012/0263048 | A1 * | 10/2012 | Chen et al. .................... 370/252 |

* cited by examiner

*Primary Examiner* — David Ton
(74) *Attorney, Agent, or Firm* — Brandon C. Kennedy; H. Daniel Schnurmann; Biggers Kennedy Lenart Spraggins LLP

(57) ABSTRACT

In a particular embodiment, a processor retrieves from memory, for each data block within the region of the memory, error correcting code (ECC) data corresponding to data stored within the data block. In one embodiment, a processor generates for each retrieved ECC data, a hash value by hashing the retrieved ECC data. In a particular embodiment, a processor combines hash values to generate a total hash value corresponding to a region of memory. In one embodiment, a processor uses a total hash value to compare a region of memory to other regions of the memory.

20 Claims, 4 Drawing Sheets

UTILIZING ERROR CORRECTING CODE DATA ASSOCIATED WITH A REGION OF MEMORY

BACKGROUND OF THE INVENTION

1. Field of the Invention

The field of the invention is data processing, or, more specifically, methods and apparatuses for utilizing error correcting code data associated with a region of memory.

2. Description of Related Art

A need often arises for a computer processor to determine whether a section of memory matches another section of memory. For example, a processor may create multiple copies of a page of data with each copy corresponding to a particular execution thread of the processor. To reduce the amount of memory space consumed, however, the processor may desire the threads to share a single copy of the data when possible. In order for the processor to reduce the multiple pages into a single copy, the processor may first seek to determine if the multiple pages are identical. One way to determine whether any two (or more) sections of memory are identical would be simply to go through the entire memory at predetermined times and compare the contents of every possible section pair and remove all redundant copies.

In contrast to the time consuming process of comparing each possible section pair, a hash function may be used to generate a hash value representing the content of one section to compare to another hash value representing the content of another section. Sections with different contents will generate different hash values, and thus not need to be compared to each other. The number of iterations required for this hash comparison is dependent on the size of the data within the regions. The size of the data being hashed, therefore, plays an important role in the number of iterations required to perform the comparison, and thus the overall performance of the processor performing the hash comparison.

SUMMARY OF EMBODIMENTS

In a particular embodiment, a processor retrieves from memory, for each data block within the region of the memory, error correcting code (ECC) data corresponding to data stored within the data block. In one embodiment, a processor generates for each retrieved ECC data, a hash value by hashing the retrieved ECC data. In a particular embodiment, a processor combines hash values to generate a total hash value corresponding to a region of memory. In one embodiment, a processor uses a total hash value to compare a region of memory to other regions of the memory. By hashing ECC data, which is of a smaller size than the data it is representative of, instead of hashing the actual data, the sample size of the hash is reduced, and thus the number of iterations required to perform the hash is reduced. Reducing the number of iterations to perform the hash comparison, reduces the time required to perform the comparison and therefore increases the performance speed of a processor utilizing the results of the hash comparison to compare memory regions.

BRIEF DESCRIPTION OF THE DRAWINGS

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
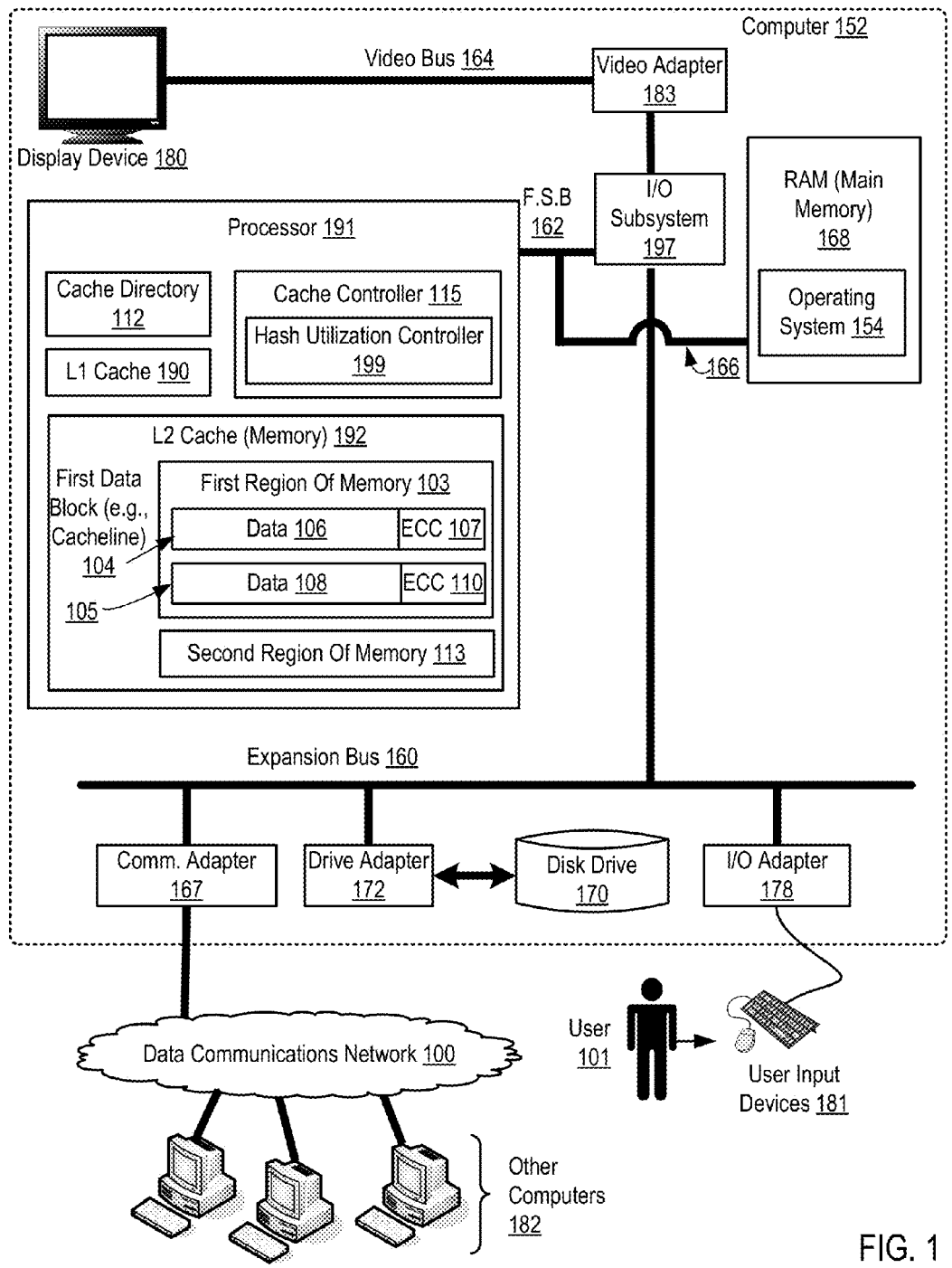
FIG. 1 sets forth a functional block diagram of an example of a computer configured to utilize error correcting code data associated with a region of memory according to embodiments of the present invention.

Examples of utilizing error correcting code data associated with a region of memory according to embodiments of the present invention are described with reference to the accompanying drawings, beginning with FIG. 1. FIG. 1 sets forth a functional block diagram of an example of a computer (152) configured to utilize error correcting code data associated with a region of memory according to embodiments of the present invention.

The computer (152) of FIG. 1 includes a processor (191) that is coupled to an input/output (I/O) subsystem (197) via a front side bus (162). Connection to the front side bus (162) enables the processor (191) to access other components of the computer (152). For example, the computer (152) of FIG. 1 includes main memory (168) which is connected through a high speed memory bus (166) to the processor (191) and to other components of the computer (152).

The processor (191) also includes a cache controller (115), a cache directory (112), a Level One (L1) cache (190), and a Level Two (L2) cache (192). The L1 cache (190) and the L2 cache (192) are specialized segments of memory used by the processor (191) to reduce memory access latency. Each cache is smaller and faster than main memory, and each cache stores copies of data from frequently used main memory locations. When a processor needs to read from or write to a location in main memory, it first checks whether a copy of that data, a "cache line," is in a cache. If so, the processor immediately reads from or writes to the cache, which is much faster than reading from or writing to main memory. As long as most memory accesses are cached memory locations, the average latency of memory accesses will be closer to the cache latency than to the latency of main memory. As mentioned, main memory is much slower than any cache, and cache misses extract a heavy toll in memory access latency.

Cache memory is organized in blocks of data referred to as 'cache lines.' Each cache line in different designs may range in size from 8 to 512 bytes or more. The size of a cache line typically is larger than the size of the usual access requested by a CPU instruction, which ranges from 1 to 16 bytes—the largest addresses and data typically handled in the general purpose registers by current 32 bit- and 64 bit-architectures being 128 bits or 16 bytes in length. Each cache line is characterized by a 'tag' composed of most significant bits of the beginning address where the contents of the cache line are stored in main memory.

In the example of FIG. 1, the processor (191) utilizes a multi-level cache with two levels, represented by the L1 cache (190) and the L2 cache (192). Multi-level caches address the tradeoff between cache latency and hit rate. Larger caches have better hit rates but longer latency. To address this tradeoff, many computers use multiple levels of cache, with small fast caches backed up by larger slower caches. Multi-level caches generally operate by checking the smallest cache (L1) first; if it hits, the processor proceeds at high speed. If the smaller cache misses, the next larger cache (L2) is checked, and so on, before main memory (168) is checked. The example computer of FIG. 1 implements two cache levels, but this is only for ease of explanation, not for limitation. Many computers implement additional levels of cache, three or even four cache levels. Some processors implement as many as three levels of on-chip cache. For example, the Alpha 21164™ has a 96 KB on-die L3 cache, and the IBM POWER4™ has a 256 MB L3 cache off-chip, shared among several processors.

The cache controller (115) is a logic circuit that manages cache memory, providing an interface among the processor (191), the L1 cache (190), the L2 cache (192), and the main memory (168). Although the cache controller (115) is represented internal to the processor (191), cache controllers on modern computers are often implemented external to processors.

In the example of FIG. 1, the L2 cache (192) includes a first region (103) and a second region (113). Although only two regions are designated, readers of skill in the art will recognize that any number of regions may be designated. The first region (103) is illustrated as having multiple data blocks. A data block is a storage location within a region. Data blocks may alternatively be referred to as cache lines. For example, the first data block (104) includes data (106) and ECC data (107), and the second data block (105) includes data (108) and ECC data (110).

An error-correcting code (ECC) or forward error correction (FEC) code is redundant data, or parity data, added to a data block, such that it can be recovered by a receiver even when a number of errors (up to the capability of the code being used) are introduced, either during the process of transmission, or on storage. In the example of FIG. 1, the ECC data (107, 110) is illustrated as immediately following the data (106, 108). In various embodiments there are no filler blocks between the data (106, 108) of the data blocks (104, 105) and the ECC data (107, 110) of the data blocks (104, 105). In other embodiments, the ECC data may be stored in a different location not adjacent to the location of its corresponding data.

The cache controller (115) includes the cache directory (112) that is a repository of information regarding cache lines in the caches. The directory records, for each cache line in all of the caches in the computer, the identity of the cache line or cache line "tag," the cache line state, MODIFIED, SHARED, INVALID, and so on, and a bit vector that specifies for each processor whether a copy of a cache line in a low level shared cache is stored in an upper cache level. The cache controller (115) consults and updates the information in the cache directory (112) with every cache operation on the computer (152). Although, the has utilization controller is illustrated in FIG. 1 as retrieving ECC data from the L2 cache, readers of skill in the art will realize that utilizing ECC data associated with a region of memory according to embodiments of the present invention may be applies to any higher level cache, such as for example, an L3 cache.

The cache controller (115) also includes a hash utilization controller (199). A hash utilization controller (199) may include firmware comprising computer program instructions for utilizing error correcting code data associated with a region of memory in accordance with the present invention. Specifically, the hash utilization controller (199) includes computer program instructions that when executed by the processor (191) cause the processor (191) to carry out the steps of: retrieving from the L2 cache (192), for each data block (104, 105) within the region (103) of the L2 cache (192), error correcting code (ECC) data (107, 110) corresponding to data (106, 108) stored within the data block (104, 105). The processor (191) also includes computer program instructions that when executed by the processor (191) cause the processor (191) to generate for each retrieved ECC data (107, 110), a hash value by hashing the retrieved ECC data (107, 110). According to embodiments of the present invention, the processor (191) is also configured to combine the hash values to generate a total hash value corresponding to the region (103) of the L2 cache (192). The processor also includes computer program instructions that when executed by the processor (191) cause the processor (191) to carry out the step of using the total hash value to compare the region (103) of the L2 cache (192) to other regions (113) of the L2 cache (192).

By hashing ECC data, which is of a smaller size than the data it is representative of, instead of hashing the actual data, the sample size of the hash is reduced and thus the number of iterations required to perform the hash is reduced. Reducing the number of iterations to perform the hash comparison, reduces the time required to perform the comparison and therefore increases the performance speed of a processor utilizing the results of the hash comparison to compare memory regions.

The main memory (168) is the principal, random access store of program data and program instructions for data processing on the computer (152). Stored in the main memory (168) is an operating system (154). Operating systems useful for utilizing ECC data associated with a region of memory according to embodiments of the present invention include UNIX™, Linux™, Microsoft XP™, AIX™, IBM's i5/OS™, and others as will occur to those of skill in the art. The operating system (154) in the example of FIG. 1 is shown in the main memory (168), but many components of such software typically are stored in non-volatile memory also, such as, for example, on a disk drive (170).

The computer (152) of FIG. 1 includes disk drive adapter (172) coupled through expansion bus (160) to the processor (191) and other components of the computer (152). Disk drive adapter (172) connects non-volatile data storage to the computer (152) in the form of disk drive (170). Disk drive adapters useful in computers for utilizing ECC data associated with a region of memory according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (183), which is an example of an I/O adapter specially designed for graphic output to a display device (180) such as a display screen or computer monitor. Video adapter (183) is connected to the processor (191) through a high speed video bus (164) and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for utilizing error correcting code data associated with a region of memory according to embodiments of the present invention include modems for wired dial-up communications, Ethernet (IEEE 802.3) adapters for wired data communications network communications, and 802.11 adapters for wireless data communications network communications.

Figure 2:
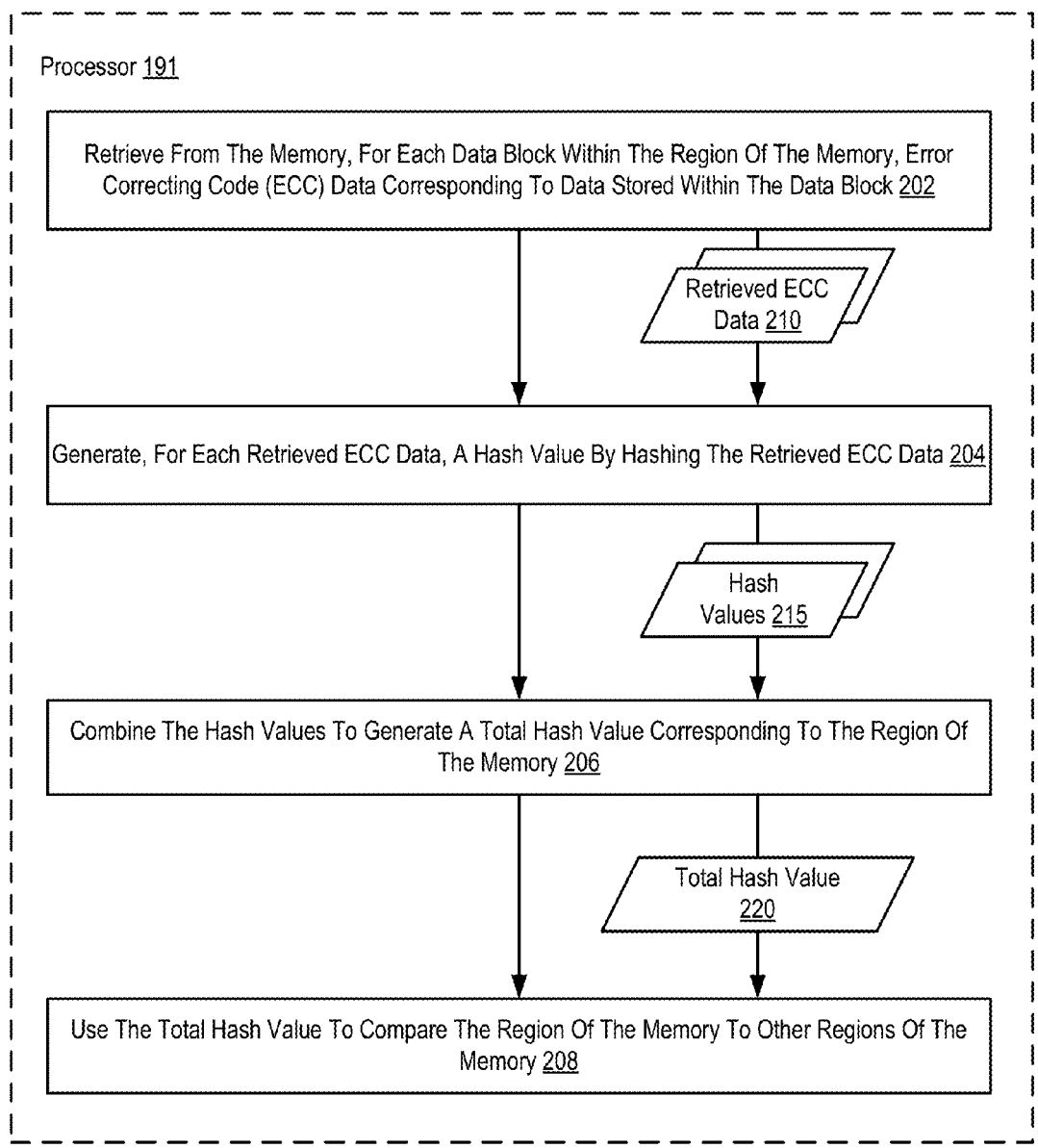
FIG. 2 sets forth a flow chart illustrating an exemplary method for utilizing error correcting code data associated with a region of memory according to embodiments of the present invention.

For further explanation, FIG. 2 sets forth a flow chart illustrating an exemplary method for utilizing error correcting code data associated with a region of memory according to embodiments of the present invention. For ease of explanation, components and data from FIG. 1 are referenced in the description of FIG. 2.

The method of FIG. 2 includes retrieving (202) from the memory (192), by a processor (191), for each data block within the region (103) of the memory (192), error correcting code (ECC) data (107, 110) corresponding to data (106, 108) stored within the data block (104, 105). An error-correcting code (ECC) or forward error correction (FEC) code is redundant data, or parity data, added to a data block, such that it can be recovered by a receiver even when a number of errors (up to the capability of the code being used) were introduced, either during the process of transmission, or on storage. Retrieving (202) from the memory (192), by a processor (191), for each data block within the region (103) of the memory (192), error correcting code (ECC) data (107, 110) corresponding to data (106, 108) stored within the data block (104, 105) may be carried out by loading the retrieved ECC data into a processor register of the processor (191).

The method of FIG. 2 also includes generating (204), by the processor (191), for each retrieved ECC data (210), a hash value (215) by hashing the retrieved ECC data (210). Generating (204), by the processor (191), for each retrieved ECC data (210), a hash value (215) by hashing the retrieved ECC data (210) may be carried out by applying a hash function. Examples of hash functions include a "Bob Jenkins" 64-bit hash function. Hashing algorithms are well known in the literature, and hash values are sometimes referred to alternatively as fingerprints, message digests, or checksums. Note that a hash value does not necessarily imply the use of a hash table. As used here and in the art of computer programming in general, a hash function is simply a function that takes a larger body of data as an argument and outputs a representation of the data in a reduced form. In other words, a hash function is a mathematical function that maps a relatively large domain onto a relatively smaller range (here, the hash value).

The method of FIG. 2 also includes combining (206), by the processor (191), the hash values (215) to generate a total hash value (220) corresponding to the region (103) of the memory (192). Combining (206), by the processor (191), the hash values (215) to generate a total hash value (220) corresponding to the region (103) of the memory (192) may be carried out by generating a total hash value indicative of the differences or lack of differences between the data blocks of the region. That is, a single hash value (total hash value) may be used to represent multiple hash values.

The method of FIG. 2 includes using (208), by the processor (191), the total hash value (220) to compare the region (103) of the memory (192) to other regions of the memory (113). Using (208), by the processor (191), the total hash value (220) to compare the region (103) of the memory (192) to other regions of the memory (113) may be carried out by comparing the total hash value of one region to the total hash value of another region of the memory.

Figure 3:
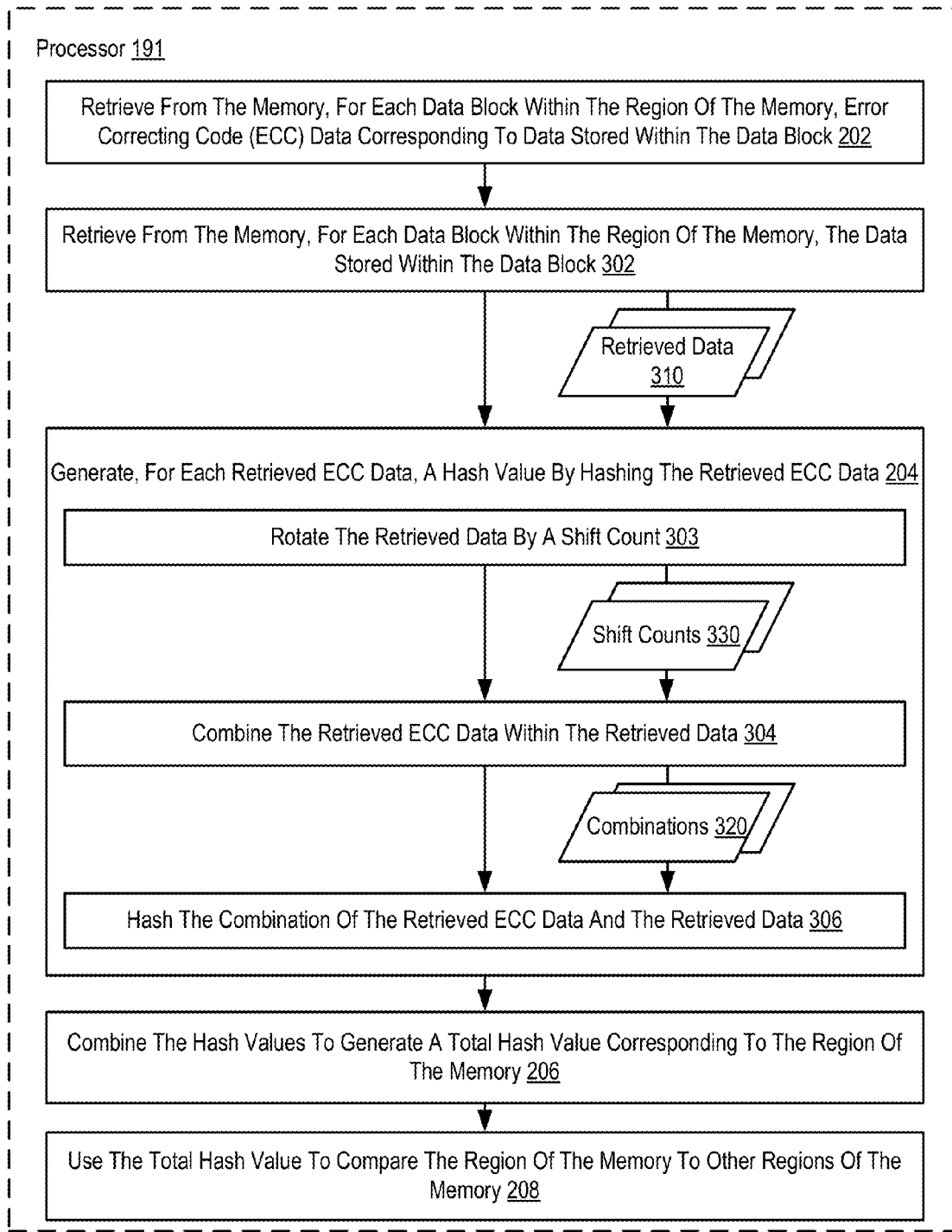
FIG. 3 sets forth a flow chart illustrating a further exemplary method for utilizing error correcting code data associated with a region of memory according to embodiments of the present invention.

For further explanation, FIG. 3 sets forth a flow chart illustrating a further exemplary method for utilizing error correcting code data associated with a region of memory according to embodiments of the present invention. For ease of explanation, components and data from FIGS. 1 and 2 are referenced in the description of FIG. 3. The method of FIG. 3 is similar to the method of FIG. 2 in that the method of FIG. 3 also includes retrieving (202) from the memory (192), for each data block within the region (103) of the memory (192), error correcting code (ECC) data (107, 110) corresponding to data (106, 108) stored within the data block (104, 105); generating (204) for each retrieved ECC data (210), a hash value (215) by hashing the retrieved ECC data (210); combining (206) the hash values (215) to generate a total hash value (220) corresponding to the region (103) of the memory (192); and using (208) the total hash value (220) to compare the region (103) of the memory (192) to other regions of the memory (113).

The method of FIG. 3, however, includes retrieving (302) from the memory (192), by the processor (191), for each data block within the region (103) of the memory (192), the data (106, 108) stored within the data block (104, 105). Retrieving (302) from the memory (192), for each data block within the region (103) of the memory (192), the data (106, 108) stored within the data block (104, 105) may be carried out by loading the data stored within the data block into a processor register or L1 cache.

In the method of FIG. 3, generating (204) for each retrieved ECC data (210), a hash value (215) by hashing the retrieved ECC data (210) includes rotating (303) the retrieved data (310) by a shift count (330). In the example of FIG. 3, each data block has a different corresponding shift count. That is, as ECC data from each data block is retrieved, a shift count is incremented to correspond to a new loop iteration. Rotating (303) the retrieved data (310) by a shift count (330) may be carried out by changing one or more bits of the retrieved data. For example, to provide considerably more data for the hash function to work on, it may be desired that an ECC load instruction uses an 'XOR' function to combine the data stored at a particular address of the data block with the ECC data that is rotated by a particular shift count. The rotation is to generate different values for cache lines containing equivalent values with equivalent ECCs. That is, the shift count corresponds to the loop iterations and thus provides a unique value for each loop iteration even if all the cache lines in a memory region contain the same exact data.

In the method of FIG. 3, generating (204) for each retrieved ECC data (210), a hash value (215) by hashing the retrieved ECC data (210) includes combining (304) the retrieved ECC data (210) with the retrieved data (310). Combining (304) the retrieved ECC data (210) with the retrieved data (310) may be carried out by applying a hash function by either rotating the ECC data by a shift count or not rotating the ECC data by a shift count. When the ECC data is not rotated, a hash function may use an 'XOR' function to combine the retrieved ECC data and the retrieved data.

In the method of FIG. 3, generating (204) for each retrieved ECC data (210), a hash value (215) by hashing the retrieved ECC data (210) includes hashing (306) the combination (320) of the retrieved ECC data (210) and the retrieved data (310). Hashing (306) the combination (320) of the retrieved ECC data (210) and the retrieved data (310) may be carried out by reducing the combination of the retrieved ECC data and the retrieved data into a single hash value.

Figure 4:
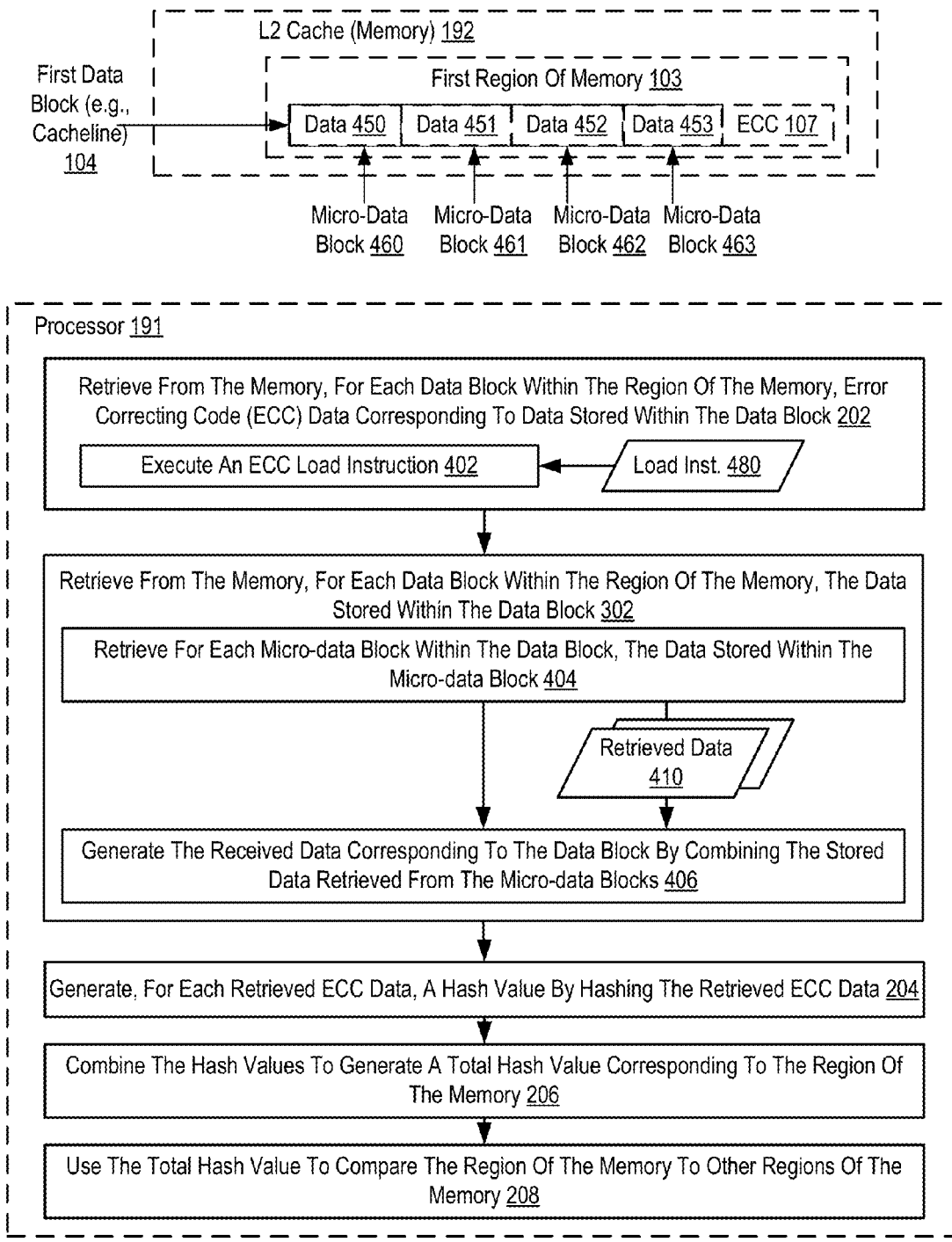
FIG. 4 sets forth a flow chart illustrating a further exemplary method for utilizing error correcting code data associated with a region of memory according to embodiments of the present invention.

For further explanation, FIG. 4 sets forth a flow chart illustrating a further exemplary method for utilizing error correcting code data associated with a region of memory according to embodiments of the present invention. For ease of explanation, components and data from FIGS. 1-3 are referenced in the description of FIG. 4. The method of FIG. 4 is similar to the method of FIGS. 2 and 3 in that the method of FIG. 4 also includes retrieving (202) from the memory (192), for each data block within the region (103) of the memory (192), error correcting code (ECC) data (107, 110) corresponding to data (106, 108) stored within the data block (104, 105); retrieving (302) from the memory (192), by the processor (191), for each data block within the region (103) of the memory (192), the data (106, 108) stored within the data block (104, 105); and generating (204) for each retrieved ECC data (210), a hash value (215) by hashing the retrieved ECC data (210); combining (206) the hash values (215) to generate a total hash value (220) corresponding to the region (103) of the memory (192); and using (208) the total hash value (220) to compare the region (103) of the memory (192) to other regions of the memory (113).

In the method of FIG. 4, however, retrieving (202) from the memory (192), for each data block within the region (103) of the memory (192), error correcting code (ECC) data (107, 110) corresponding to data (106, 108) stored within the data block (104, 105) includes executing (402), by the processor (191), an ECC load instruction (480). An ECC load instruction may be a type of processor instruction that when executed by a processor causes the processor to load ECC data corresponding to data stored within a particular cache line.

In the example of FIG. 4, the first data block (104) of the L2 cache (192) contains four micro-data blocks (460-463). A micro-data block contains a section of data stored at a particular address within a cache line. For example, each micro-data block has corresponding data (450-453) that when combined together forms the data (106) of FIG. 1.

In the method of FIG. 4, retrieving (302) from the memory (192), by the processor (191), for each data block within the region (103) of the memory (192), the data (106, 108) stored within the data block (104, 105) includes retrieving (404) for each micro-data block (460-463) within the data block (104), the data (450-453) stored within the micro-data block (460-463). Retrieving (404) for each micro-data block (460-463) within the data block (104), the data (450-453) stored within the micro-data block (460-463) may be carried out by loading the retrieved data (450-453) into a processor register.

In the method of FIG. 4, retrieving (302) from the memory (192), by the processor (191), for each data block within the region (103) of the memory (192), the data (106, 108) stored within the data block (104, 105) includes generating (406) the received data (310) corresponding to the data block (104, 105) by combining the stored data (410) retrieved from the micro-data blocks (460-463). Generating (406) the received data (310) corresponding to the data block (104, 105) by combining the stored data (410) retrieved from the micro-data blocks (460-463) may be carried out by applying an 'XOR' function that combines the stored data (410).

Exemplary embodiments of the present invention are described largely in the context of a fully functional computer system for utilizing error correcting code data associated with a region of memory. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of utilizing error correcting code data associated with a region of memory, the region of memory containing a plurality of data blocks, the method comprising:
   retrieving from the memory, by a processor, for each data block within the region of the memory, error correcting code (ECC) data corresponding to data stored within the data block;
   generating, by the processor, for each retrieved ECC data, a hash value by hashing the retrieved ECC data; and
   combining, by the processor, the hash values to generate a total hash value corresponding to the region of the memory.

2. The method of claim 1 further comprising using, by the processor, the total hash value to compare the region of the memory to other regions of the memory.

3. The method of claim 1 further comprising retrieving from the memory, by the processor, for each data block within the region of the memory, the data stored within the data block.

4. The method of claim 3, wherein generating for each retrieved ECC data, a hash value by hashing the ECC data includes:
   combining the retrieved ECC data with the retrieved data; and
   hashing the combination of the retrieved ECC data and the retrieved data.

5. The method of claim 4, wherein generating for each retrieved ECC data, a hash value by hashing the ECC data includes rotating the retrieved data by a shift count, wherein each data block has a different corresponding shift count.

6. The method of claim 3, wherein each data block includes a plurality of micro-data blocks, each micro-data block containing stored data.

7. The method of claim 6, wherein retrieving for each data block within the region of the memory, the data stored within the data block includes:
   retrieving for each micro-data block within the data block, the data stored within the micro-data block; and
   generating the received data corresponding to the data block by combining the stored data retrieved from the micro-data blocks.

8. The method of claim 1, wherein retrieving from the memory, for each data block within the region of memory, ECC data corresponding to the data stored within the data block includes executing, by the processor, an ECC load instruction.

9. The method of claim 1, wherein each data block is an individual cache line within the memory.

10. The method of claim 1, wherein the memory is a higher level cache.

11. An apparatus for utilizing error correcting code data associated with a region of cache memory, the apparatus comprising a computer processor, a computer memory operatively coupled to the computer processor, the computer memory having disposed within it computer program instructions that when executed by the computer processor cause the apparatus to carry out the steps of:
retrieving from the memory, by a processor, for each data block within the region of the memory, error correcting code (ECC) data corresponding to data stored within the data block;
generating, by the processor, for each retrieved ECC data, a hash value by hashing the retrieved ECC data; and
combining, by the processor, the hash values to generate a total hash value corresponding to the region of the memory.

12. The apparatus of claim 11 further comprising computer program instructions that when executed by the computer processor cause the apparatus to carry out the steps of using, by the processor, the total hash value to compare the region of the memory to other regions of the memory.

13. The apparatus of claim 11 further comprising computer program instructions that when executed by the computer processor cause the apparatus to carry out the steps of retrieving from the memory, by the processor, for each data block within the region of the memory, the data stored within the data block.

14. The apparatus of claim 13, wherein generating for each retrieved ECC data, a hash value by hashing the ECC data includes:
combining the retrieved ECC data with the retrieved data; and
hashing the combination of the retrieved ECC data and the retrieved data.

15. The apparatus of claim 14, wherein generating for each retrieved ECC data, a hash value by hashing the ECC data includes rotating the retrieved data by a shift count, wherein each data block has a different corresponding shift count.

16. The apparatus of claim 13, wherein each data block includes a plurality of micro-data blocks, each micro-data block containing stored data.

17. The apparatus of claim 16, wherein retrieving for each data block within the region of the memory, the data stored within the data block includes:
retrieving for each micro-data block within the data block, the data stored within the micro-data block; and
generating the received data corresponding to the data block by combining the stored data retrieved from the micro-data blocks.

18. The apparatus of claim 11, wherein retrieving from the memory, for each data block within the region of memory, ECC data corresponding to the data stored within the data block includes executing, by the processor, an ECC load instruction.

19. The apparatus of claim 11, wherein each data block is an individual cache line within the memory.

20. The apparatus of claim 11, wherein the memory is a higher level cache.

* * * * *